(12) United States Patent
Jasa et al.

(10) Patent No.: US 9,279,840 B2
(45) Date of Patent: *Mar. 8, 2016

(54) METHOD AND SYSTEM THAT DETERMINES THE VALUE OF A RESISTOR IN LINEAR AND NON-LINEAR RESISTOR SETS

(75) Inventors: Hrvoje Jasa, Scarborough, ME (US); Gregory A. Maher, Cape Elizabeth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 905 days.

This patent is subject to a terminal disclaimer.

(21) Appl. No.: 13/469,737

(22) Filed: May 11, 2012

(65) Prior Publication Data
US 2012/0223728 A1    Sep. 6, 2012

Related U.S. Application Data

(63) Continuation of application No. 12/196,552, filed on Aug. 22, 2008, now Pat. No. 8,179,151.

(60) Provisional application No. 61/042,340, filed on Apr. 4, 2008.

(51) Int. Cl.
*G01R 27/08* (2006.01)
*G01R 31/08* (2006.01)
(Continued)

(52) U.S. Cl.
CPC .............. *G01R 27/14* (2013.01); *G01R 27/02* (2013.01); *G01R 27/205* (2013.01)

(58) Field of Classification Search
CPC ........ G01R 27/14; G01R 33/09; G01R 27/02; G01R 27/205
USPC .......................................... 324/525, 691, 713
See application file for complete search history.

(56) References Cited

U.S. PATENT DOCUMENTS 4,228,394 A    10/1980  Crosby
5,783,926 A *  7/1998  Moon et al. ................. 320/106
(Continued)

FOREIGN PATENT DOCUMENTS

CN    1242522 A    1/2000
CN    1431643 A    7/2003
(Continued)

OTHER PUBLICATIONS

"U.S. Appl. No. 12/196,552, 312 Amendment mailed Apr. 4, 2012", 4 pgs.

(Continued)

*Primary Examiner* — Amy He
(74) *Attorney, Agent, or Firm* — Schwegman Lundberg & Woessner, P.A.

(57) ABSTRACT

The present subject matter refers to apparatus and methods for identifying a resistance level of a resistor. In an example, circuit configured to identify a resistor can include a plurality of current sources, each current source selectively coupled to the resistor to generate a resistor voltage, a comparator configured to compare the resistor voltage and a reference voltage, and to provide an output indicative of the comparison, and a controller configured to selectively couple a first one or more current sources of the plurality of current sources to the resistor, and to selectively couple a second one or more current sources of the plurality of current sources to the resistor in response to the output indicative of the comparison.

11 Claims, 4 Drawing Sheets

(51) Int. Cl.
*G01R 27/14* (2006.01)
*G01R 27/02* (2006.01)
*G01R 27/20* (2006.01)

(56) References Cited

U.S. PATENT DOCUMENTS

| | | | |
|---|---|---|---|
| 6,225,802 | B1 | 5/2001 | Ramalho et al. |
| 6,812,715 | B2 | 11/2004 | Chiozzi et al. |
| 7,965,090 | B2 | 6/2011 | Kwak |
| 2005/0268000 | A1* | 12/2005 | Carlson .......................... 710/15 |

FOREIGN PATENT DOCUMENTS

| | | |
|---|---|---|
| CN | 1512477 A | 7/2004 |
| CN | 1595808 A | 3/2005 |
| CN | 102047129 B | 10/2013 |
| WO | WO-2007096796 A2 | 8/2007 |
| WO | WO-2008018196 A1 | 2/2008 |
| WO | WO-2009123707 A1 | 10/2009 |

OTHER PUBLICATIONS

"U.S. Appl. No. 12/196,552, Non Final Office Action mailed Aug. 4, 2011", 9 pgs.

"U.S. Appl. No. 12/196,552, Notice of Allowance mailed Jan. 11, 2012", 7 pgs.

"U.S. Appl. No. 12/196,552, Response filed Nov. 4, 2011 to Non Final Office Action mailed Aug. 4, 2011", 13 pgs.

"U.S. Appl. No. 12/196,552, Response to 312 Amendment mailed Apr. 12, 2012", 2 pgs.

"International Application Serial No. PCT/IB2007/050394, International Search Report", 3 pgs.

"International Application Serial No. PCT/US2009/002007, International Preliminary Report on Patentability mailed Oct. 5, 2010", 7 pgs.

"International Application Serial No. PCT/US2009/002007, International Search Report and Written Opinion mailed Aug. 4, 2009", 13 pgs.

"Chinese Application Serial No. 200980120210.1, Office Action mailed Dec. 14, 2012", w/ English Claims, 23 pgs.

"Chinese Application Serial No. 200980120210.1, Response filed Jun. 6, 2013 to Office Action mailed Dec. 14, 2012", w/ English Claims, 13 pgs.

"Korean Application Serial No. 10-2010-7024818 Office Action mailed Feb. 28, 2015", w/ English Claims, 7 pgs.

"Korean Application Serial No. 10-2010-7024818, Response filed Apr. 30, 2015 to Office Action mailed Feb. 28, 2015", w/ English Claims, 19 pgs.

\* cited by examiner

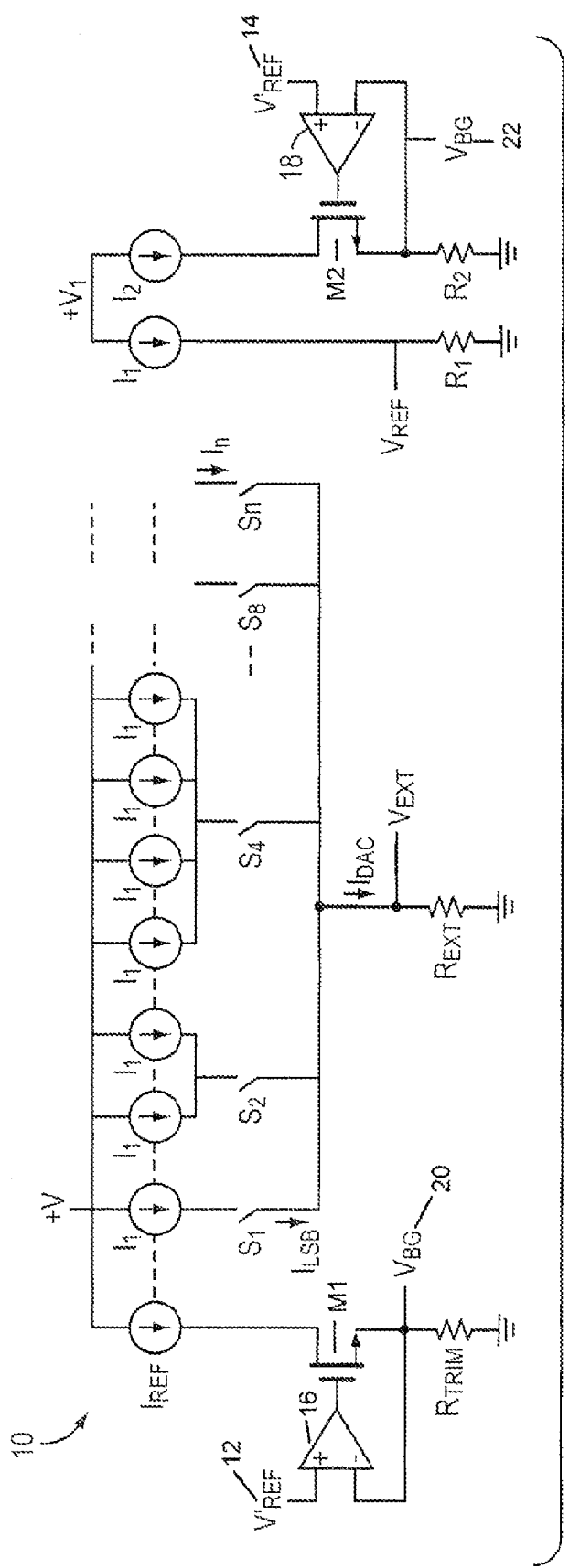
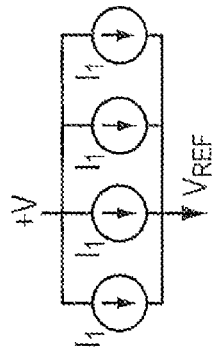
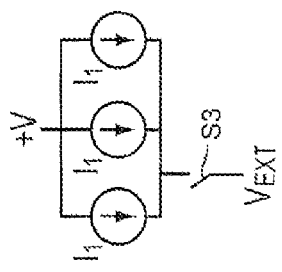
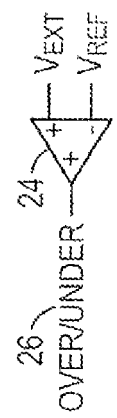
FIG. 1A
FIG. 1B
FIG. 1C
FIG. 1D

METHOD AND SYSTEM THAT DETERMINES THE VALUE OF A RESISTOR IN LINEAR AND NON-LINEAR RESISTOR SETS

RELATED APPLICATIONS

This application is a continuation of and claims the benefit of priority under 35 U.S.C., §120 to U.S. patent application Ser. No. 12/196,552, filed on Aug. 22, 2008, which claims the benefit of priority to U.S. Provisional Patent Application Ser. No. 61/042,340, filed on Apr. 4, 2008, the benefit of priority of each of which is claimed hereby, and each of which are incorporated by reference herein in its entirety.

TECHNICAL FIELD

This application relates to systems that measure resistors that define particular accessories, and more particularly to measuring these resistors in accessories attached to mobile devices.

BACKGROUND

Different vendors of accessories for mobile telephones and other mobile devices have built-in unique resistors values that identify the different accessories. When attached, the mobile device detects the value of the resistor that identifies the specific accessory. The operation of that accessory may then be executed without further actions by a human user.

Limitations exist when designing systems to measure these resistors. More specifically, the dynamic range of the resistors involved place limitations on minimum currents and/or voltages involved.

SUMMARY

The present subject matter provides an IDAC (current Digital to Analog Converter) designed to determine the values of external resistors that are built in to identify the accessories. For example, an audio or display accessory connected to a cell phone or other mobile device will present a specific resistor across specific cell phone contacts. The cell phone can measure the resistance to identify the accessory.

The IDAC can output incremental currents that develop voltages across the external resistor. The voltages are compared to a reference voltage and the current changed until the voltages match. Illustratively, a current source is configured in multiples of a least significant bit (LSB) current and directed across the external resistor developing an external voltage. The system provides a known reference voltage, and the reference voltage is successively compared to the external voltage as the incremental current is changed. Note the incremental current may be positive or negative. Also note that the term "connected" is defined as "coupled" or "functionally connected" where other components by be inserted in the "connection" that do not interfere with the present invention.

Depending on the comparison, the IDAC output current is incremented sequentially. For example, a series of current sources may be addressed by five binary bits—the decimal equivalent for the five bits is 0 to 31. Each combination may activate one of 32 switches each of which connect a current associated with that switch to the external resistor.

If an accessory is connected to a mobile device, as mentioned above, it presents a specific external resistor identifying the accessory to the mobile device. A binary addressed series of current sources may be sequentially driven into the external resistor developing a voltage, Vext. Although the current sources may be addressed in a binary fashion, the current delivered from each addressed current need not be an increasing binary multiple. For example, a sequence of incremental currents may be multiples of the LSB current-such as X1 (one times the LSB), then X2 followed by X3, and, for example, followed by X1 again.

A reference voltage, Vref, is generated and Vext is compared to Vref. The comparison outcome is input to a controller that adjusts by either turning on the next current source in sequence, or determining that the last added current was enough and the binary code for the last current source added yields the value of the resistor and thus the accessory is identified. Additionally, the binary code may then be a pointer to the program (software) that drives the accessory.

The present present subject matter may be applied to a linear set of resistors, but also to a non-linear set. For a linear set of external resistors the range might be from about 13K ohms to 665K ohms, or a scale of about 50/1. Illustratively, the LSB (least significant bit) IDAC current may be about 1.5 uA. For a non-linear set, however, the range may be 500/1, or from about 2K ohms to about 1M ohms. The difficulty ties with the accommodating the very large external resistors that require very small currents. In one embodiment, the LSB current from the DAC is about 0.5 uA.

For the non-linear resistor set, current sources, like those employed for a linear resistor set, may be activated but reduced in current value by simultaneously activating current sinks. The current sinks subtract current from the sources and thus reduce the current reaching the external resistor.

Illustratively, when a multiple of the LSB current source is constructed, e.g. X5, a mirror transistor might be constructed five times larger than the LSB transistor. In certain examples, five mirror transistors of a substantially equivalent sized to the LSB transistor can be used. In some examples, the multiple identically sized mirror transistors can be more precisely constructed compared to larger mirror transistors.

It will be appreciated by those skilled in the art that although the following Detailed Description will proceed with reference being made to illustrative embodiments, the drawings, and methods of use, the present subject matter is not intended to be limited to these embodiments and methods of use. Rather, the present invention is of broad scope and is intended to be defined as only set forth in the accompanying claims.

BRIEF DESCRIPTION OF THE DRAWINGS

The detailed description below refers to the accompanying drawings, of which:

FIG. 1A is a schematic of an example system employing current sources;

FIG. 1B is a schematic segments showing one possible configuration of multiple current sources;

FIG. 1C is a schematic segment illustrating multiple sources for a reference current;

FIG. 1D is a schematic illustrating generation of an over/under signal;

DETAILED DESCRIPTION OF AN ILLUSTRATIVE EMBODIMENT

Figure 2:
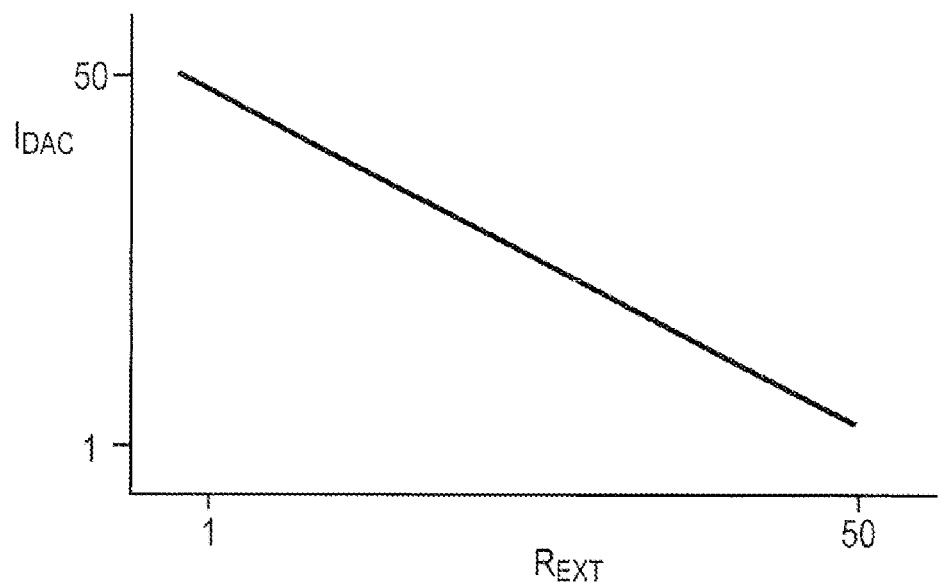
FIGS. 2 and 3 are graphical profiles of resistor sets.

Linear DAC FIG. 1A.

If the external resistor set is based on a linear progression of resistance values, a linear IDAC 10 may be employed to measure the external resistance.

If the external resistor, Rext, belongs to a linear progression of resistors, then $R_{EXT}=mX$ where m is the slope and X is the unit resistance, and the external resistors will fall on a linear graph trace of Rext versus X. To determine the external resistor, use the following algorithm, see FIG. 1A:
$V_{EXT} = I_{DAC} R_{EXT}$ $$I_{DAC} = N \frac{V_{BG}}{R_{TRIM}} = N I_{LBS}$$

where N $\{0, 1, 2, \ldots 2^n\}$, and $V_{BG}$ is a process independent voltage. In FIG. 1A $R_{TRIM}$ is an internal resistor that is trimmed during manufacture to supply a precision current of $I_{REF}$, $I_{REF}$ may be arranged as the least significant current ($I_{LSB}$), but $I_{REF}$ may be constructed as a multiple of $I_{LSB}$.

The trimming largely eliminates process variations and since $R_{TRIM}$ is constructed with a tow temperature coefficient, the IDAC is independent of Process and Temperature. A reference voltage, $V_{REF}$, is constructed to be independent of the supply voltage, for example, a reference developed from a bandgap reference (known to those skilled in the art). When constructed in this manner the system is largely independent of PVT (Process, Voltage, Temperature) parameters. In FIG. 1A, a reference voltage V'REF is formed at 12 and 14 and via the operational amplifiers 16 and 18, and transistors M1 and M2, respectively, forming two versions of $V_{BG}$, 20 and 22. $V_{BG}$ 22 develops a current through R2, that is mirrored via I1 and I2 to develop a voltage across R1. That voltage is VREF and it is connected to one input of the comparator 24.

$$V_{REF} = \frac{V_{BG} R_1}{R_2} \text{ Setting } V_{REF} = V_{EXT} \text{ gives:}$$

$$\frac{V_{BG} R_1}{R_2} = N \frac{V_{BG}}{R_{TRIM}} R_{EXT} \text{ or } R_{EXT} = \frac{R_1 R_{TRIM}}{N R_2}$$

REXT is a resistance value of a ratio of resistors and a scalar N. Because R1 and R2 set the reference voltage they are consistent across PVT (Process, supply Voltage, and Temperature). As mentioned above, $R_{TRIM}$ is set at manufacture to have very low PVT.

A digital state machine, not shown, selects values of N in such a manner to find when the two voltages are equal within a tolerance (usually the LSB). This value of N then defines which value of external Resistance was connected. The design choice of N and $I_{LSB}$ are governed by the range of the external resistances. Generally the choice of $R_{EXT}$MAX would be used to define the choice of $I_{LSB}$ where $$I_{LSB} = \frac{V_{REF}}{R_{EXT} \text{MAX}},$$

if the slope of the resistances possible for Rext is m=$2^n$ then a binary weighted IDAC may directly determine the Rext value. In the case where in ≠2, the values of Rext are not binary weighted, the $I_{LSB}$ can be determined per the smallest increment of consecutive external resistance values, or $$I_{LSB} = \frac{V_{BG}}{\Delta R_{EXTMIN}}.$$

On the left of FIG. 1A, V'ref forms $V_{BG}$ 20 at the output of operational amplifier 16. $V_{BG}$ 20 divided by the settable Rtrim defined Iref. In a binary arrangement, IREF is mirrored 10 at the single I1 connected through S1 to the Rext: then switch S2 connects two I1 mirrors; then S4 connects four I1 mirrors, and so forth.

Notice that the switches may be addressed in binary, but the currents need not be. For example, in FIG. 1B, three I1's are connected through the switch S3. There may, however, be only one I1 or many more connected to S3.

FIG. 1C illustrates that the IREF may be formed from multiples of the ILSB. For example, if Rtrim set the IREF current to be precisely 2.0 uA, and there were four identically sized transistors all in parallel, as shown in FIG. 1C, precisely 0.5 uA would flow through each. Then a same sized mirror of one of these transistors would carry 0.5 uA, and that would form the LSB current. The mirrors connected by the switches (S1-Sn) may, as discussed herein, each have many more parallel same sized transistors to deliver a multiple of the LSB current. For example, switch S8 of FIG. 1A, may have eight mirrors delivering 4.0 uA to the $I_{DAC}$.

The current mirrors, I1 to in are directed to Rext by like labeled switches.

The state machine, again not shown, accepts the over/under output from the comparator 24 (FIG. 1D) and adjusts the switch contacts S1, S2, S4, S8, S16 accordingly. In one example of FIG. 1, VREF is set at 2V, IREF at the ILSB at 1.5 uA, and N has the values of 0 to 31, where Sn is a five bit binary code, 00000 to 11111. In this case, there are switches S1, S2, S4, S8, and S16.

In this example, with no switches activated, no current flows through Rext and VEXT is zero. This starting point of the smallest current first has the advantage of expending the minimum power. VREF is higher than VEXT and over/under 26 is low. The state machine may activate S1 driving ILSB through The 1.5 uA flows through Rext and develops a VEXT. If VEXT remains lower than VREF, the over/under 26 goes low, the state machine resets S1, a turns on S2, and tests over/under again. Here two time the ILSB 10 is delivered to REXT doubling VEXT. If over/under remains low, the state machine leaves S2 on, turns on S1 again so that three time ILSB is delivered to REXT tripling VEXT. This continues in a binary fashion, adding an ILSB each time until an adding causes the over/under to go high. At that point the binary value of the switches turned on indicates the values of the REXT. As mentioned above that value may point directly to a program to handle the accessory.

As known to those skilled in the art, other algorithms may be used to find the value of the REXT. Most notably, successive approximations, where the remaining range for each try is halved, is commonly used. Note again that the incremental changes may be positive or negative.

In practical examples, the higher the REXT value the smaller the binary number, so that the linear resistance curve has a negative slope of VEXT against REXT. So if REXT is a short circuit, all the current source switches will be turned on but the VEXT will remain lower than VREF (say VREF is 2V). The resulting binary code for a REXT of zero ohms will be 11111, or decimal 31. Similarly, when REXT is it maximum value, say 665K ohms, each of the switches S16, S8, S4 will be reset. S2 on will drive 3.0 uA through 665K ohms and that will be slightly (1.995V) less than 2.0V. So S2 will be on and S1 will be off. The result is a binary code of 00010, or decimal 2.

In practice with the process in use, an LSB of 0.5 to 2.0 uA is reasonable with a Vref of 2.0V and a resistor set running from values of about 12.7K to 665K ohms.

FIG. 2 illustrates the negative slope showing IDAC decreasing as REXT increases. A 50/1 dynamic range for the REXT and IDAC is depicted.

Non-Linear Resistor Sets

Different mobile device makers may choose non-linear resistor sets. This makes the design of the detection circuit more difficult. The difficulty lies in that the choice of the external resistors forces the use of very small currents in the I$_{DAC}$. An example of such a resistor set is characterized below.

Note that in this resistor set the range is 2KΩ to 1000 KΩ. This is a dynamic range of 500/1 (compared to the linear example of 50/1).

Figure 3:
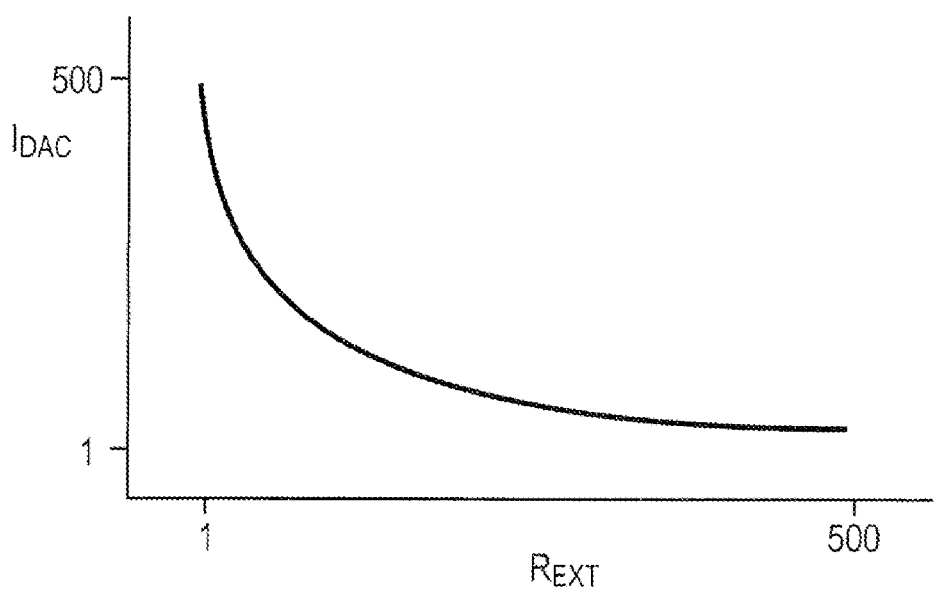

FIG. 3 illustrates a non-linear curve I$_{DAC}$ to R$_{EXT}$ curve is illustrated depicting a 500/1 dynamic range for the R$_{EXT}$ and I$_{DAC}$. The range of R$_{EXT}$ might run from about 2K Ohms to about 1M ohm. An equation for an example of this curve is:

$$y(current) = 1149.6e^{-0.2045x}.$$

Non-Linear Resistor Solution

The linear algorithm must be modified to resolve the non-linear example. The problem with the non-linear is that the currents are low valued and finding a common value that would scale is problematic. At the low value of resistors there is no problem with the initial architecture. The problem lies in the higher resistor values. This is because the spacing of the resistors and the current required to hit the target reference voltage becomes difficult to achieve. By adding a set of precision sink currents to the circuit, the higher value resistors are resolved, and lower valued accessories may be resolved as in the linear case.

To evaluate the higher valued resistors the following relationship is employed:

$$V_{EXT} = I_{LSB}(n-k)R_{EXT}.$$

Figure 4:
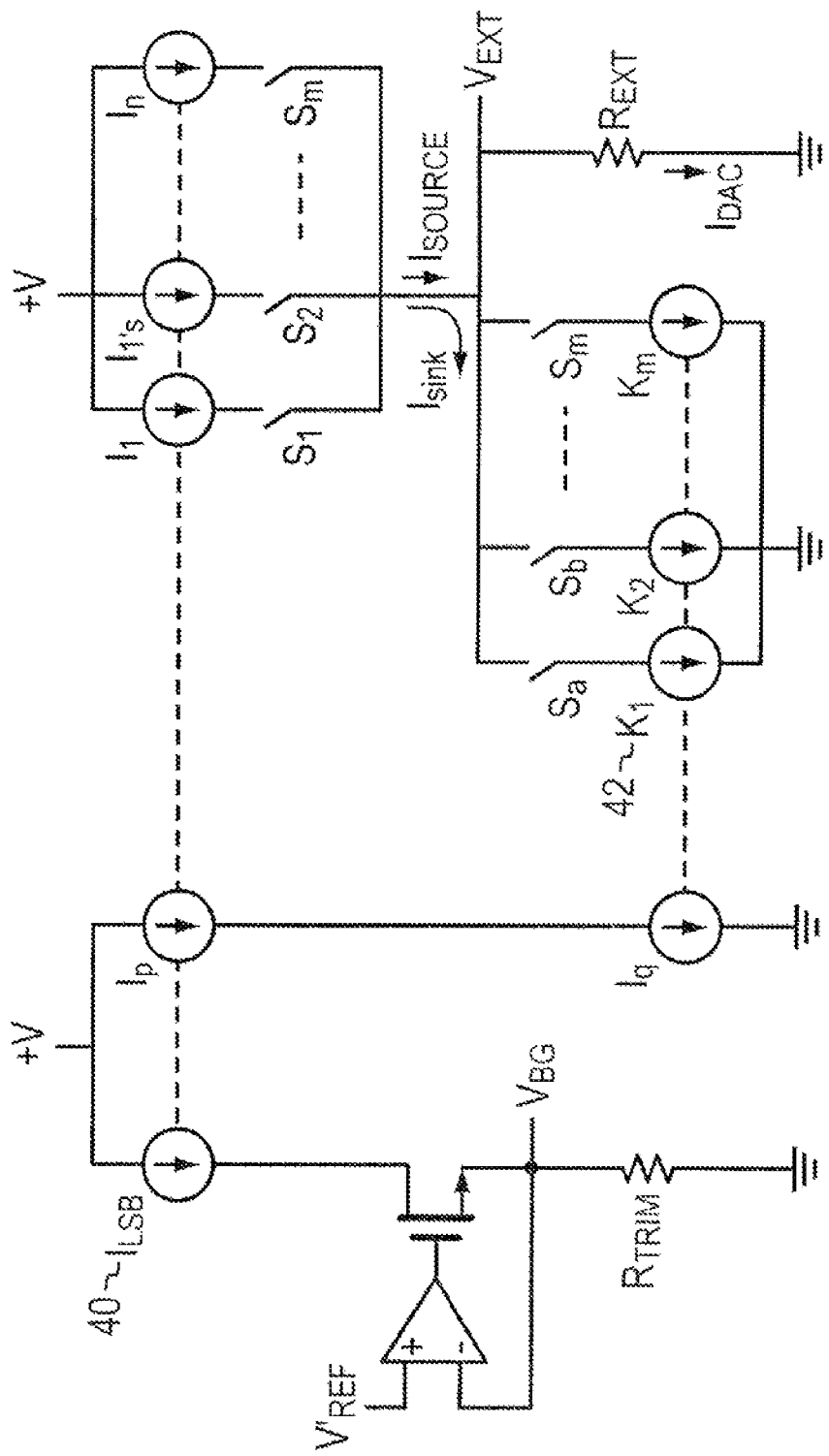
FIG. 4 is a schematic illustrating use of current sinks.

In FIG. 4 the trimmed precision I$_{LSB}$ (Iref) current 40 is mirrored down via Ip and Iq to a set of k current sinks 42. Here Ip and Iq are the LSB current, but the K1, K2, and K3 mirrors may be multiple parallel current sources as shown for FIG. 1A above. The summing junction of the currents is the point where the currents from the sources (I1's) and the sinks (k's) converge to produce I$_{DAC}$ through the external resistor to form V$_{EXT}$. The system constructs a number, n, current sources, and a number, m, current sinks. The sink current subtract from the source currents to form the I$_{DAC}$ current through R$_{EXT}$ to form V$_{EXT}$. Using the prior example with a V$_{REF}$ of 2.0V, if a current of 0.5 uA was needed to yield V$_{EXT}$ of 2.0V, the source current might be 16 uA while the sink current might be 15.5 uA to yield a I$_{DAC}$ current of 0.5 uA. If the R$_{EXT}$ were 4.0M ohms, V$_{EXT}$ would the 2.0V.

In one application, with the value of n predetermined, the value of k may be selected to reliably distinguish a non-linear resistor se, as would be known to those skilled in the art.

Figure 5:
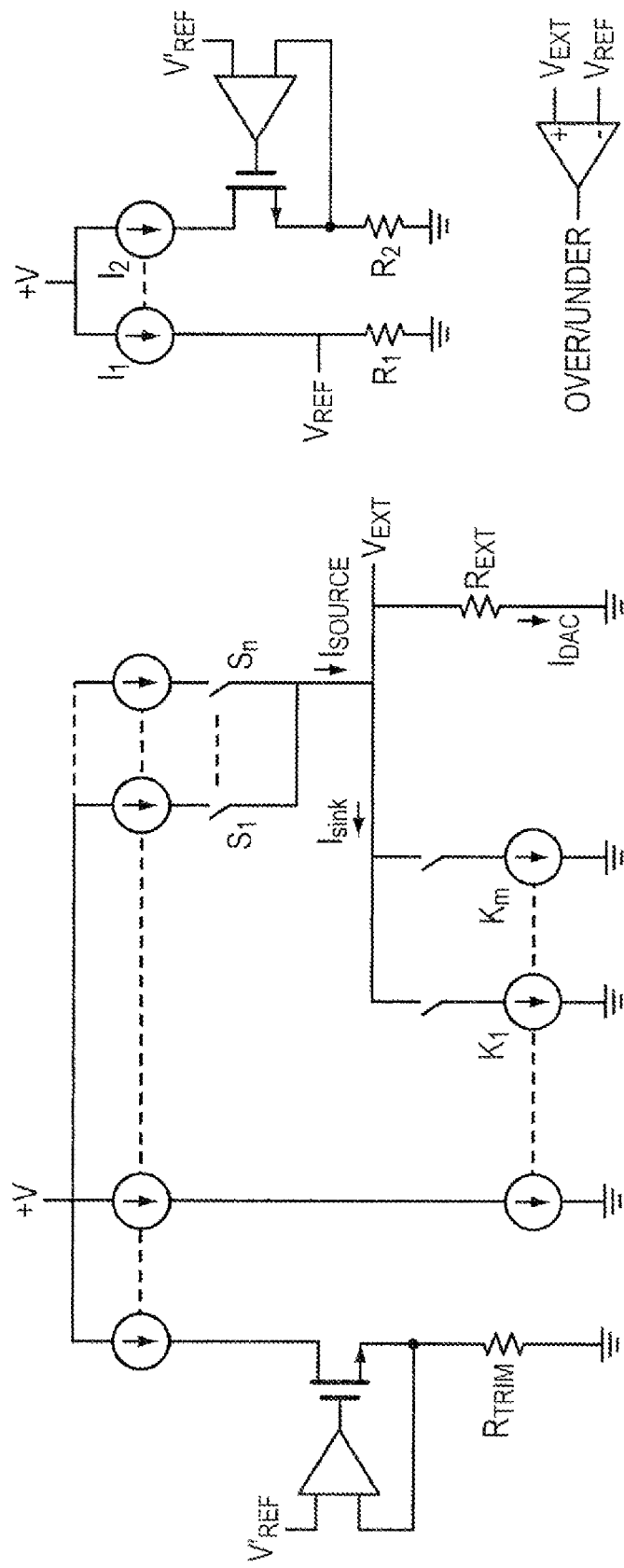
FIG. 5 is a schematic of a system employing current sinks and sources.

FIG. 5 illustrates the completed circuit of current source and current sinks.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A circuit configured to identify a resistor, the circuit comprising:
   a plurality of current sources, each current source configured to selectively couple to the resistor to generate a resistor voltage;
   a comparator configured to compare the resistor voltage and a reference voltage, and to provide an output indicative of the comparison; and
   a controller configured to selectively couple a first one or more current sources of the plurality of current sources to the resistor, and to selectively couple a second one or more current sources of the plurality of current sources to the resistor in response to the output indicative of the comparison.

2. The circuit of claim 1, wherein the plurality of current sources include a current mirror.

3. The circuit of claim 2, wherein the current mirror includes a plurality of mirror transistors.

4. The circuit of claim 1, including a plurality of switches configured to selectively couple the plurality of current sources to the resistor, each switch of the plurality of switches responsive to a command received from the controller.

5. The circuit of claim 4, wherein the plurality of switches includes a sequence of switches, wherein a first switch of the sequence of switches is coupled to a first current source of the plurality of current sources and each successive switch of the sequence of switches is coupled to a binary multiple number of current sources of the plurality of current sources.

6. The circuit of claim 1, including a plurality of current sinks configured to selectively sink current of one or more of the plurality of current sources, wherein the plurality of current sources and the plurality of current sinks are configured to provide a predetermined current to the resistor responsive to the controller.

7. The circuit of claim 1, wherein the controller is configured to identify the resistor based on the selectively coupled second one or more current sources and the output indicative of the comparison.

8. The circuit of claim 7, wherein the controller is configured to identify the resistor when the output indicative of the comparison changes from a first state to a second state.

9. A method for identifying a resistance value of a resistor, the method comprising:
   coupling a first one or more current sources of a plurality of current sources to the resistor to generate a resistor voltage;
   comparing the resistor voltage and a reference voltage using a comparator
   providing an output indicative of the comparison of the resistor voltage and the reference voltage; and
   selectively coupling a second one or more current sources of the plurality of current sources to the resistor in response to the output indicative of the comparison.

10. The method of claim 9, including providing an output indicative of the resistance value based on the selectively coupled second one or more current sources of the plurality of current sources and the output indicative of the comparison.

11. The method of claim 10, wherein providing an output indicative of the resistance value includes providing a binary code indicative of the resistance value based on the selectively coupled second one or more current sources of the plurality of current sources and the output indicative of the comparison.

* * * * *